United States Patent [19]

Hamilton

[11] 4,245,169
[45] Jan. 13, 1981

[54] SAMPLING CIRCUIT AND METHOD THEREFOR

[75] Inventor: Clark Hamilton, Boulder, Colo.

[73] Assignee: The United States of America as represented by the Secretary of Commerce, Washington, D.C.

[21] Appl. No.: 20,359

[22] Filed: Mar. 14, 1979

Related U.S. Application Data

[63] Continuation-in-part of Ser. No. 853,354, Nov. 21, 1977, abandoned.

[51] Int. Cl.³ .................... H03K 5/153; H03K 5/24
[52] U.S. Cl. .................................. 307/350; 307/306; 307/352; 324/102; 328/151
[58] Field of Search .............. 307/227, 306, 277, 350, 307/352, 212; 328/117, 151; 324/102, 127

[56] References Cited

U.S. PATENT DOCUMENTS

| 3,764,905 | 10/1973 | Zappe | 324/102 |
| 3,983,419 | 9/1976 | Fang | 307/277 |

Primary Examiner—John Zazworsky
Attorney, Agent, or Firm—Eugene J. Pawlikowski; Alvin J. Englert

[57] ABSTRACT

A sampling circuit and method therefor including a first Josephson junction for producing a series of sampling pulses for activating a second Josephson junction that is receptive of both the analog current signal being sampled and a bias current. The first Josephson junction is continually triggered at a fixed time relative to the repetitive analog signal to provide a series of sampling pulses and before each sampling pulse the bias level to the second Josephson junction is changed until the sum of the current from the sampling pulse, from the analog signal, and from the bias source exceeds the critical current value of the second Josephson junction causing it to switch from one voltage state to another. The value of the bias current at the point of switching is proportional to the current in the analog signal.

In one embodiment, the bias current is increased in a step-like fashion for each sampling pulse from the first Josephson junction until the critical value of the second Josephson junction is reached. The resolution of the analog signal for this embodiment is 1/N if there are N samples.

In another embodiment where the analog signal is known to exist between two extremes, the bias current for the first sample is initially positioned at a mid-range value between the extremes. If, at the sample time, the second Josephson junction is switched, the bias current for the next sample is reduced by $\frac{1}{4}$. If the second Josephson junction has not switched, the bias current is increased by $\frac{1}{4}$ for the next sample. This process continues for N samples, the resulting resolution being $\frac{1}{2}^N$.

8 Claims, 7 Drawing Figures

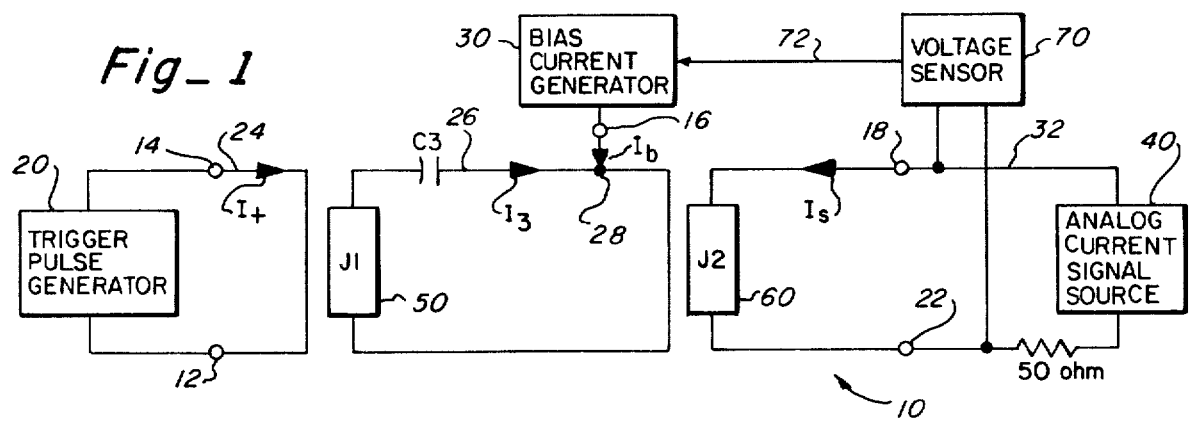
Fig_1
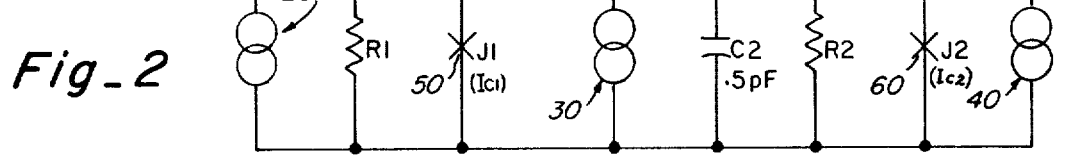
Fig_2
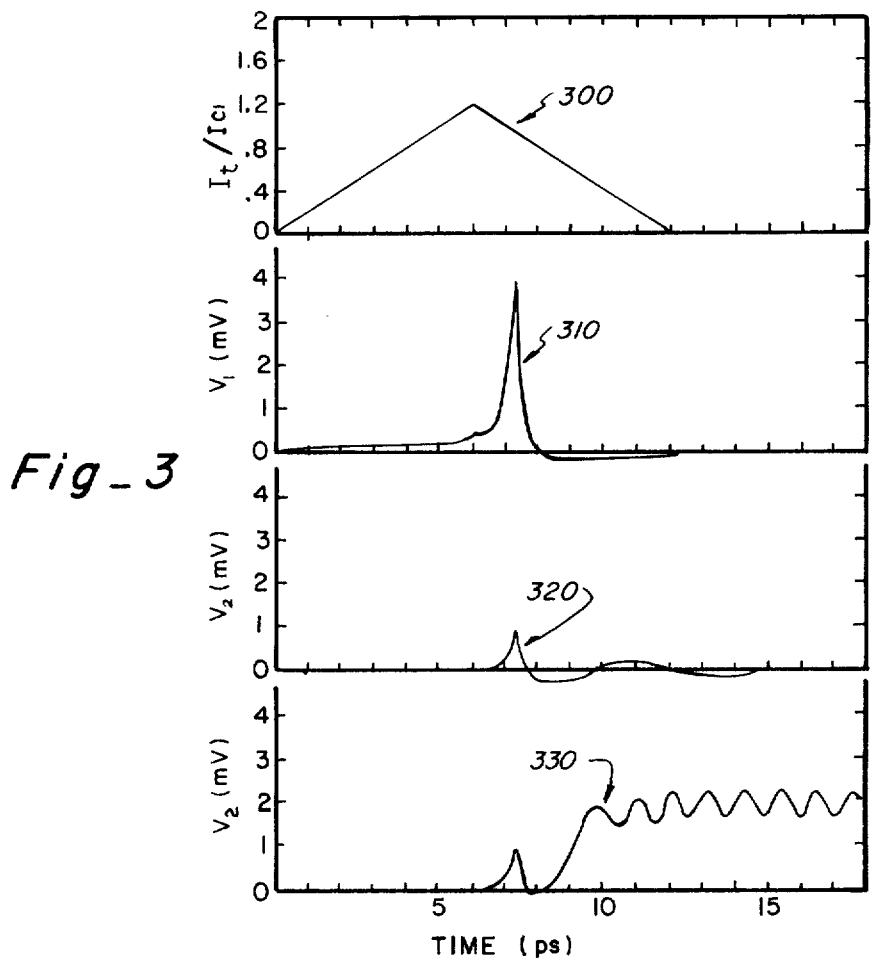
Fig_3

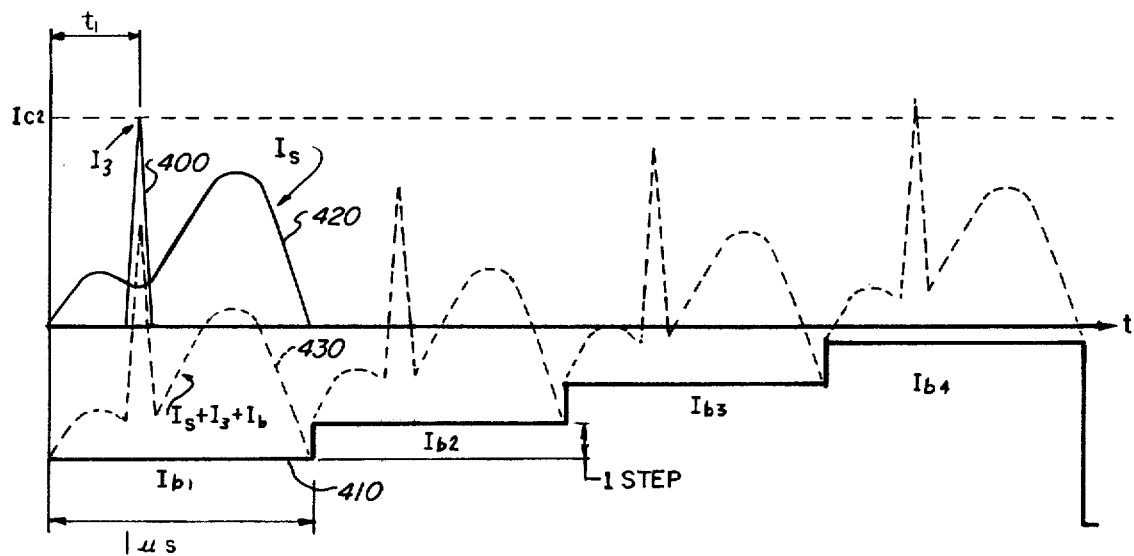
Fig_4
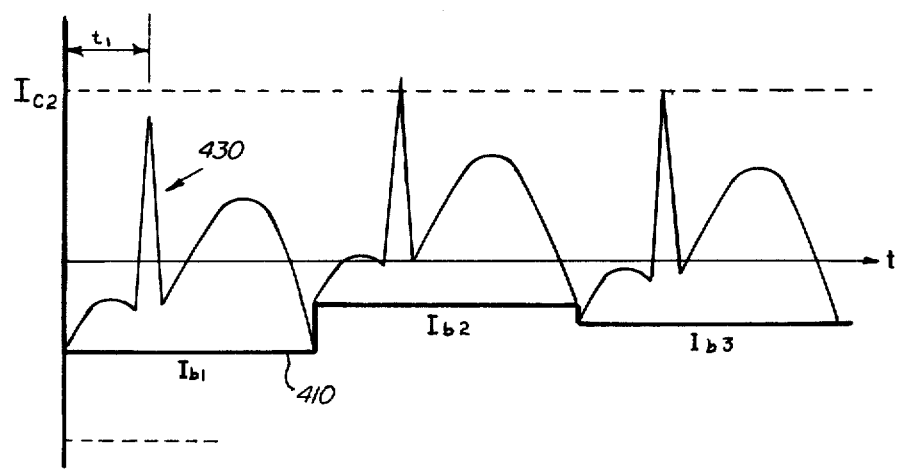
Fig_5

SAMPLING CIRCUIT AND METHOD THEREFOR

This application is a continuation-in-part of my earlier application, Ser. No. 853,354 filed on Nov. 21, 1977, now abandoned.

BACKGROUND OF THE INVENTION

1. Field of the Invention

This invention relates to a high speed sampling circuit for analysis of fast signal waveforms, and more particularly to a circuit using two Josephson junction devices, one as a sampling pulse generator and one as an amplitude discriminator to obtain a very short sample of a repetitive waveform.

2. Background of the Invention

U.S. Pat. No. 3,983,419 issued to Fang entitled "Analog Waveform Transducing Circuit" provides an excellent discussion of the background for use of Josephson tunneling devices in sampling circuits.

One earlier approach mentioned is that of Zappe, U.S. Pat. No. 3,764,905 issued on Oct. 9, 1973, entitled "Apparatus for Measuring Pulsed Signals Using Josephson Tunneling Devices". In Zappe, two Josephson junctions were utilized. Each Josephson device was interconnected in a superconductive loop wherein the first loop and device captured a given quantity of magnetic flux quanta from a signal during a predetermined amount of time (termed "acquisition time"). The first loop and device could be switched between two states—one state termed "resistive" enabled the magnetic flux from the input signal to intercept the first loop and the second state is termed "non-resistive" which enabled the first loop to trap the intercepted flux thus providing a permanent measure of the signal level at the time of transition to the non-resistive state. The second loop and device was then utilized to measure the persistent current (which is proportional to the trapped flux) in the first loop.

In the Fang approach, only one Josephson junction device was utilized and it was connected in series with a signal source. The junction was further connected in a superconductive loop which contained distributed inductance. A control loop was utilized to switch the Josephson device between the "resistive" and the "non-resistive" states. In the "resistive" state, substantially all of the current from the signal source passed through the superconductive loop. When the current in the control loop was reduced to zero, the device switched to its superconductive state (i.e. the "non-resistive" state) and since the inductance in the device was smaller than the inductance in the circuit, the current flowing in the loop was maintained at its value. In Fang, the acquisition time (the time required for the superconducting circuit to be updated to the current value of the sampling current) was determined by the time constant L/R of the circuit which was estimated by Fang to be on the order of 10 picoseconds. The holding time (i.e. time during which the sample can be held at a constant value) in principle was indefinite.

The two above prior art approaches both rely upon sampling a signal by trapping magnetic flux in a superconducting loop containing a Josephson junction device. As pointed out in Fang and graphically shown in Fang's FIG. 20, it is highly desirable to have an acquisition time such that the measured signal can substantially track the applied analog signal. As previously mentioned, the acquisition time is limited by the L/R time constant of the superconducting loop. The critical shortcoming of these two approaches, therefore, is the time required for acquisition.

My approach overcomes this critical shortcoming in that a superconducting loop is not utilized and the acquisition time is determined solely by the switching time of the Josephson devices without any additional time required for flux to penetrate a loop. However, my approach is limited by the factor that many samples at a given point in the repetitive waveform must be made in order to resolve the analog signal level at that point. In comparison, the Zappe and Fang methods provide many bits of resolution from a single sample. However, in sampling oscilloscope applications, having a short acquisition time is generally more important than minimizing the number of required samples.

My approach is based upon the effect that a Josephson junction is capable of producing extremely short voltage pulses. The following references discuss this phenomena: Pierre Gueret, IEEE Trans. Magnetics, p. 751 (1975), Pierre Geuret, Applied Physics Letters, Vol. 25, p. 426, 1974 and C. S. Owen et al Physical Review, Vol. 164, p. 538-544, 1967. In fact, the higher the impedance connected to the Josephson device, the shorter in time the pulse will be. By utilizing one Josephson device to produce short pulses together with a second Josephson device acting as a latching type amplitude discriminator, a short sample of an analog signal can be obtained. The result is an apparatus that can be used in a sampling oscilloscope to achieve a resolution time of a few picoseconds.

OBJECTS OF THE PRESENT INVENTION

It is an object of the present invention to provide a new and novel circuit and method for measuring the value of analog current signals.

It is another object of the present invention to provide a Josephson sampler having a minimum acquisition time.

It is a further object of the present invention to provide a new and novel circuit and method utilizing a first Josephson junction as a pulse generator and a second Josephson junction as an amplitude discriminator.

It is a further object of the present invention to provide a new and novel sampling circuit for determining the value of an analog current signal wherein the circuit includes a means for generating trigger pulses, a first Josephson junction which upon receipt of each of the trigger pulses generates a sampling voltage pulse, means for converting the sampling voltage pulses into sampling current pulses, means for generating steps of increasing bias current with each trigger pulse, and a second Josephson junction receptive of the sampling current pulses, the bias current steps, and of the analog current signal for switching from a first state to a second state only when the sum of the current from the sample pulse, the analog signal, and the bias step exceeds the critical current value of the second Josephson junction wherein the value of the bias current at the time switching occurs is proportional to the value of the analog current.

It is a further object of the present invention to provide a new and novel method for determining the value of an analog current signal including the steps of generating a trigger pulse, generating a pulse of sampling current in response to a current of the trigger pulse, producing bias current, generating an output signal only when the sum of the bias signal, the sampling current, and the analog current exceeds a predetermined value, decreasing the bias current in response to the signal, increasing the bias current in response to the lack of said signal, and repeating the aforementioned steps a predetermined number of cycles so that a specific sampling accuracy is obtained.

Other objects, advantages, and capabilities of the present invention will become more apparent as the description proceeds taken in conjunction with the accompanying drawings.

DESCRIPTION OF THE DRAWING

FIG. 1 is an illustration of the sampling circuit of the present invention.

FIG. 2 is a lump circuit model of the sampling circuit shown in FIG. 1.

FIG. 3 graphically represents the generation of the significant pulses of the sampling circuit of FIG. 1.

FIG. 4 illustrates a first preferred method whereby bias current is steppedly increased.

FIG. 5 illustrates a second preferred method wherein the value of the analog current is quickly determined by splitting halves.

DETAILED SPECIFICATION

Figure 6:
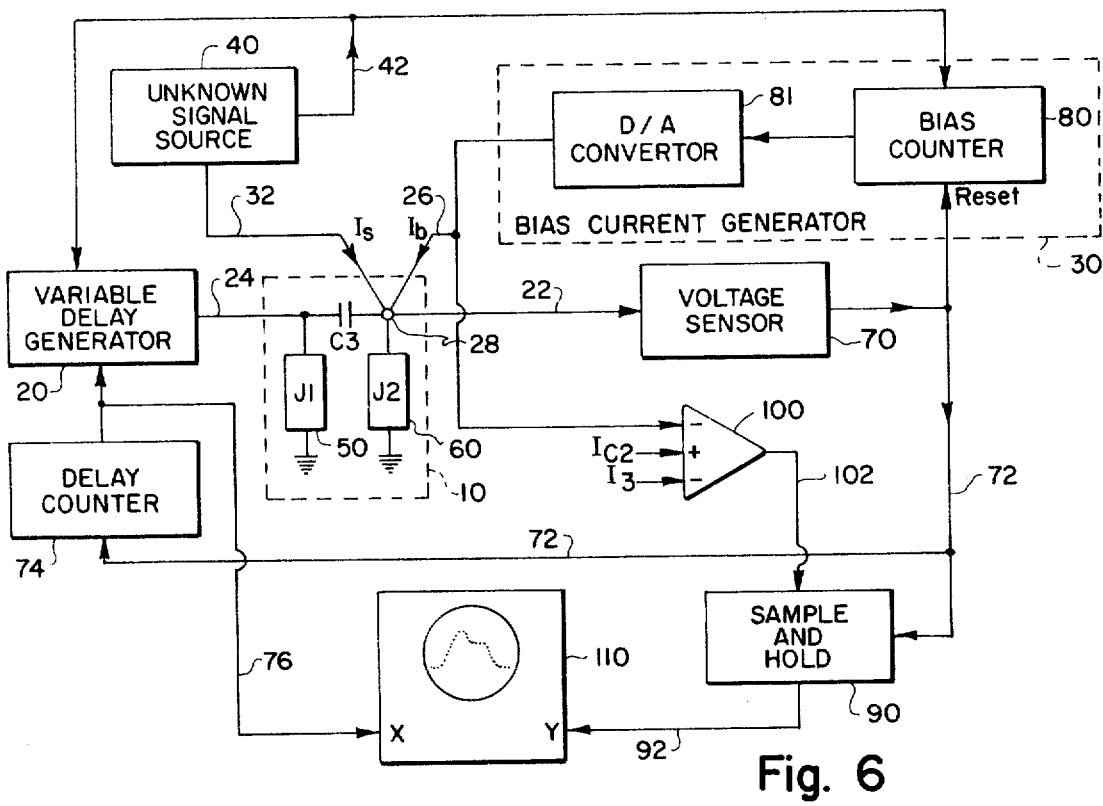
FIG. 6 is an electronic schematic for the first embodiment for the sampling circuit of the present invention.

FIG. 1 illustrates the sampling circuit 10 of the present invention interconnected with the conventionally available components of a trigger pulse generator 20, a bias current generator 30, and a voltage sensor 70. The components are interconnected to sample and determine the value of an analog current signal source 40. Two sampling circuit embodiments are set forth in FIGS. 6 and 7. The embodiment set forth in FIG. 6 will be discussed first.

In FIG. 6 is shown a first embodiment of the sampling circuit 10 of the present invention interconnected via line 32 to an unknown analog signal source 40, via line 24 to a variable delay generator 20, via line 22 to a voltage sensor 70 and over line 26 to a bias current generator 30. These components are conventional. The bias current generator 30 includes a bias counter 80 (such as decade counters SN 7490 from Texas Instruments) and a digital-to-analog converter 81 (such as DAC 1136 from Analog Devices). The voltage sensor 70 is an Operational Amplifier (such as LM 308 from National Semiconductor). The variable delay generator 20 is a Hewlett Packard 813B Pulse Generator.

Although the coupling of the various signals to Josephson junctions 50 and 60 is shown to be direct, capacitive (FIG. 1) or inductance coupling may also be used. The purpose of the circuit is to determine the waveform of the repetitive signal produced by the unknown signal source 40. It is assumed that the unknown signal source 40 can also supply a repetitive trigger pulse via line 42 which is synchronized with the beginning of the unknown signal waveform. This is conventional. The sampled signal is displayed in a conventional oscilloscope 110 by means of a conventional sample-and-hold circuit 90 (AD 582 from Analog Devices) and a delay counter 74 (SN 7490 from Texas Instruments).

As is well known in the art, the current, I, through the Josephson junction 50 and 60 is described by $$I = \frac{V}{R_n} + C\frac{dv}{dt} + I_c \sin \int \frac{2ev}{\hbar} dt,$$  Formula 1 where
V = voltage across the junction
$R_n$ = shunt resistance inherent in the junction
C = shunt capacitance inherent in the junction
$I_c$ = junction critical current
e = electron charge
$\hbar$ = Planck's constant
t = time.

Junction 60 is made such that the hysteresis parameter $\beta$ (which equals by definition $2eI_cR_n{}^2C/\hbar$) is greater than one. This gives it the property that for current magnitudes less than $I_c$ it has zero voltage drop while for current magnitude greater than $I_c$ it rapidly switches to a voltage of a few millivolts. The current must then be reduced well below $I_c$ before the junction will reset to the zero voltage state. Thus junction 60 acts like a latching type amplitude discriminator.

Junction 50 is made with sufficiently small capacitance (C) that $\beta < 1$. This gives it the property that it can produce very short pulses. If a slow current pulse of the right amplitude is applied to junction 50 it will produce a single very fast voltage pulse. During this pulse, the argument of the sin term in Formula 1 changes by $2\pi$. The pulse is therefore the result of a "$2\pi$ phase transition" in Formula 1.

The circuit operates as follows. Initially the bias current generator 30 is set to some negative value N thus producing a negative bias current, $I_b$, at junction 60 over lead 26. The initial delay of delay generator 20 is set to zero. At the beginning of the unknown signal cycle a trigger pulse is delivered on line 42 to the variable delay generator 20. Since the initial delay is zero the trigger pulse passes immediately to junction 50 which then produces an extremely short voltage sampling pulse $I_3$. This sampling pulse is combined at node 28 with the unknown signal $I_s$ and the negative bias current $I_b$.

When the sum of the currents from these three sources (i.e., $I_3 + I_b + I_s$) exceeds the critical current of junction 60, $I_{c2}$, then junction 60 will switch to the voltage state. When this occurs, it has been determined that $I_{c2} = I_3 + I_b + I_s$ or conversly $I_s = I_{c2} - I_b - I_3$. Thus the value of the unknown signal is determined at the time the sampling pulse occurred.

The voltage sensor 70 detects the voltage on junction 60 and transmits the computed value of $I_s$ to an equivalent time display 92 via the sample and hold circuit 90. If junction 60 does not switch during the first cycle, the bias level $I_b$ is incremented by counter 80 and the operation repeats until an output voltage is detected.

The value of the signal at later times is determined by incrementing the delay counter 74 via line 72, resetting the bias counter 80 via line 72 and again incrementing the bias on each successive cycle until junction 60 switches. The value of the delay counter 74 is therefore the equivalent time signal. When this operation has proceeded for delay values up to the maximum duration of the repetitive signal, the signal waveform will appear as a series of dots on the equivalent time display 92. It is to be understood that the sampling pulse is very short relative to variations in the signal and that therefore the signal may be assumed to be constant over the sampling interval. The only variable over each repetitive waveform is the bias current $I_b$. A simplified circuit model is shown in FIG. 2 of the sampling circuit 10, the delayed signal trigger source 20, the bias current generator 30, and the analog current source 40 shown in FIG. 1. As described previously, Josephson junction 50 is a low capacitance junction or it may be a shaped junction capable of supporting one or more vortex modes of the type taught by Pierre Gueret, IEEE MAG-11, p. 751, 1975; Gueret and Owen, et al. in the previously cited references. The sampling pulses occur each time junction 50 undergoes a $2\pi$ phase transition as described previously. The $2\pi$ phase transition is effectuated by relatively slow pulses appearing on the trigger line which is coupled to junction 50. The amplitude and duration of the resulting sampling pulse is primarily determined by the junction capacitance. Assuming no capacitance, as an extreme value, the resulting sampling pulse width is on the order $h/\pi\Delta$ or approximately 1 ps (since h is Planck's constant and $\Delta$ is the superconducting energy gap).

For illustrative purposes, the lumped circuit model of FIG. 2 assumes no capacitance in junction 50 and an internal resistance of $R_1$. It is assumed that the critical current of junction J1, $I_{c1}$, equals 10 mA and that $I_{c1} \times R_1 = 2$ mV. An assumed shape for the trigger pulse is shown by curve 300 of FIG. 3. Curve 300 represents a ratio of $I_t/I_{c1}$ for a 12 ps trigger pulse duration. Curve 300 causes the Josephson junction 50 to generate a $2\pi$ phase transition sampling voltage pulse 310 having a peak voltage of about 4 mV and an average pulse width of about 1 ps. Pulse 310 may occur after the peak of trigger pulse 300 because of the time delay in the circuit. The pulse 310 occurs at $V_1$ in FIG. 2 and is delivered through coupling capacitor $C_3$ (0.2 pF) to generate a sampling current pulse designated $I_3$ into node 28. The generating of the pulse 310 is a function of the trigger pulse 300. It has been calculated, using Formula 1, that a signal pulse 310 is generated of that magnitude and at that point in time with the pulse 300. If the pulse 300 is increased in time length a number of pulses will be generated. On the other hand if the pulse 300 is decreased in time length no pulse will be generated.

As mentioned, if the current into the second Josephson junction 60 exceeds a critical value, termed $I_{c2}$, then the junction 60 switches from the zero voltage to the finite voltage state. The current relationship at the switch point can be expressed mathematically as follows:

$$I_{c2} = I_s + I_3 + I_b \qquad \text{Formula 2}$$

$I_{c2}$ = the critical current of Junction 60
$I_s$ = analog signal
$I_3$ = sampling current pulses
$I_b$ = bias current.

Assuming that the sum of $I_3$, $I_s$, and $I_b$ is less than the critical value of $I_{c2}$, then the resulting voltage across junction 60 is shown as curve 320 and the junction 60 remains in the zero voltage state. If, however, the sum of currents $I_b$, $I_3$, and $I_3$ exceed the value of $I_{c2}$, then Josephson junction 60 switches into the finite voltage state (about 2 mV) as shown by curve 330.

As mentioned, Josephson junction 60 is designed to be utilized as a latching type amplitude discriminator as taught by J. Matisoo, Proc. IEEE 55, p. 172, 1967. Because of capacitor $C_2$ (e.g. 0.5 pF), Josephson junction 60 is lightly damped causing it to operate as a hysteresis switch between the zero and finite voltage states.

For simulation purposes, the value of $I_{c2}$ in FIG. 2 is 1 mA and $R_2 I_{c2} = 2$ mV.

In summary, FIG. 3 illustrates how a trigger pulse 300 operates on Josephson junction 50 to output a voltage sampling pulse 310 of extremely short duration. Under proper current conditions, sampling pulse 310 operates on junction 60 to cause it to switch from one voltage condition to a second voltage condition.

The operation of the sampling circuit 10 will now be discussed. Formula 2 above can be rewritten as follows:

$$I_s = I_{c2} - I_3 - I_b \qquad \text{Formula 3}$$

In the given sampling circuit 10, the peak value of $I_3$ and the value of $I_{c2}$ are constants. Therefore, Formula 2 can be rewritten as follows:

$$I_s = K = I_b \qquad \text{Formula 4}$$

where $K = I_{c2} - I_3$

Thus, the unknown value of the analog current signal, $I_s$, can be determined by the sampling circuit 10 by knowing the value of the bias current $I_b$ from the bias current generator 30. The sampling circuit 10 operates to signal the event of equality in Formula 4 above in the following fashion by reference to FIG. 4 and Formula 2. In FIG. 6, the value of $I_s$ is determined by operational amplifier 100 which is an LM 308 from National Semiconductor biased as set forth above for $I_{c2}$ and $I_3$.

In FIG. 4, a graphical representation of the operation of the sampling circuit 10 of the present invention is shown. The horizontal axis represents time whereas the vertical axis represents current. Curve 400 represents the sampling current pulses $I_s$ derivable from the voltage sampling pulse 310 shown in FIG. 3. In the example shown, the peak value of $I_3$ is equal to the critical current $I_{c2}$, which is the amount of current necessary to cause the second Josephson junction 60 to change state. Since the bias current $I_b$ is negative, junction 60 may or may not switch depending on the value of the signal current $I_s$. As mentioned $I_3$ (peak) and $I_{c2}$ are constants and when substituted into Formula 4:

$$I_s = -I_b \text{ at the trigger point} \qquad \text{Formula 5}$$

since $k = 0$.

In FIG. 4, $I_b$ is shown by curve 410 to be a series of negative steps (i.e. $I_{b1}$, $I_{b2}$, etc.) of increasing (less negative) current. The analog current signal $I_s$ is represented by curve 420. The repetitive current through the Josephson junction 60 is the sum of the three currents, $I_3$, $I_{b1}$, and $I_s$, and is shown by the dotted line curve 430. During the time interval that $I_{b1}$ occurs, the sum of the three currents has a maximum value (occurring with the peak of $I_3$) that is substantially less than $I_{c2}$. Therefore, the junction 60 will not switch. Voltage sensor 70 determines that junction 60 has not switched. This information is transmitted via line 72 to the Bias Current Generator 30 causing it to increase the bias current by an amount $I_{step}$ to a new value $I_{b2}$. During the next cycle of the signal, the sampling pulse $I_3$ is again generated. Again, during the time that $I_{b2}$ is present, the peak of curve 430 is below the switch level of $I_{c2}$. Once again, curve 410 representing the bias current $I_b$ is increased by an amount termed $I_{step}$ and once again during $I_{b3}$, a sampling pulse is generated and the junction fails to switch. However, during step $I_{b4}$, the peak exceeds the value of $I_{c2}$, the critical value, and the junction device 60 therefore switches into the finite voltage state.

When the voltage sensor 70 detects that junction 60 has switched to the voltage state, it is apparent that the correct value of $I_s$ lies somewhere between $I_{b3}$ and $I_{b4}$ by the amount of $I_{step}$. Therefore, the accuracy with which $I_s$ is determined by Formula 5 depends upon the step separation of $I_b$. If there are N such equally spaced steps, the signal will be determined with a resolution of 1/N.

When the Josephson junction 60 switches into the finite voltage state, the value of $I_{b4}$ represents the value of the analog current signal at point $t_1$ in the repetitive waveform within a certain resolution. The voltage transition of junction 60 is sensed by the voltage sensor 70 and the switching information is delivered to the bias current generator 30 over lead 72.

If the sampling circuit 10 is utilized in a sampling oscilloscope, the signal at time $t_1$ as determined from $I_b$, is plotted as a single point on the scope. The sampling of the next point in time $t_2$ now occurs by slightly moving (not shown) the generation of the sampling pulse having its peak at $I_3$ forward along the analog current curve 420. In this manner, the signal value at all points in time is determined with a given accuracy. It is important to note, that the resolution time of the sample is simply the $2\pi$ phase transition time of the first Josephson junction device 50.

In summary, the operation is best described by reference to FIG. 6. The unknown signal source 40 which contains the signal to be measured and displayed in, for example, oscilloscope 110 generates a signal over line 32 to the sampling circuit 10. Additionally, a trigger signal is generated over line 42. The sampling circuit 10 of the present invention sequences its way through the unknown signal, point-by-point, until a series of points is displayed on the oscilloscope 110. The sequencing occurs as follows. Initially, delay counter 74 is set to zero thereby providing a zero delay in the variable delay generator 20. The bias counter 80 is also set to zero thereby providing a predetermined low bias current for $I_b$ on lead 26. This bias counter 80 is continually incremented over lead 42 with each signal repetition thereby increasing bias current $I_b$ until a voltage is detected by voltage sensor 70. At that time, the value of the unknown signal source at that particular point in time has been determined and a signal is generated on lead 72 from the voltage sensor 70. That signal on lead 72 resets the bias counter 80 to zero and enters the value of the unknown signal, at that particular point in time, over lead 102 into the sampling hold circuit 90. The sampled value is thereupon displayed on the oscilloscope 110 in a conventional fashion. The voltage signal on lead 72 from the voltage sensor 70 also increments the delay counter 74 to provide a delay to the variable delay generator 20. Hence, with the next trigger signal on lead 42, the value of the unknown signal at the next point in time is determined in a similar fashion. Therefore, the entire value of the unknown signal can be ascertained and displayed in the oscilloscope 110.

While FIG. 4 illustrates the technique of using a staircase function from the bias current generator 30, the successive approximation method of adjusting $I_b$, although more complex, is more efficient. If it is assumed that the signal level, $I_s$, is always between two values, such as 0 and 1, then during the first sample at time $t_1$, $-I_b$ can be set to a value midway between the two limiting values or, for example, to $\frac{1}{2}$. This sample determines whether $I_s$ is greater or less than $\frac{1}{2}$ (depending on whether junction 60 is in the zero or finite voltage state). If it is greater, as determined by voltage sensor 70, $-I_b$ for the next sample is set to the next mid position, for example, $\frac{3}{4}$. If it is less, $-I_b$ is set to the lower mid position, for example, $\frac{1}{4}$, and so on. By splitting the difference in each successive sample, one bit of resolution is obtained for each sample. Thus, 10 samples resolve the signal to one part in $2^{10}$ or one part in 1024 (i.e. N samples results in a resolution of $\frac{1}{2}^N$). FIG. 5 shows a typical sequence of bias current levels determined in this way. During the first sample $I_{b1}$ is set to $-\frac{1}{2}$ and junction 60 does not switch. In the second sample, $I_{b2}$ is therefore set to $-\frac{1}{4}$ and junction 60 does switch. Thus in the third sample $I_{b3}$ is set to $-\frac{3}{8}$ and junction 60 does switch. Thus in three samples the signal level at time $t_1$ is determined to be between $\frac{3}{8}$ and $\frac{1}{4}$ (i.e. a resolution of one part in eight). It is to be understood that any conventional circuit can be used to increase or decrease the bias signal according to the signal appearing on lead 72 in the above described fashion.

Figure 7:
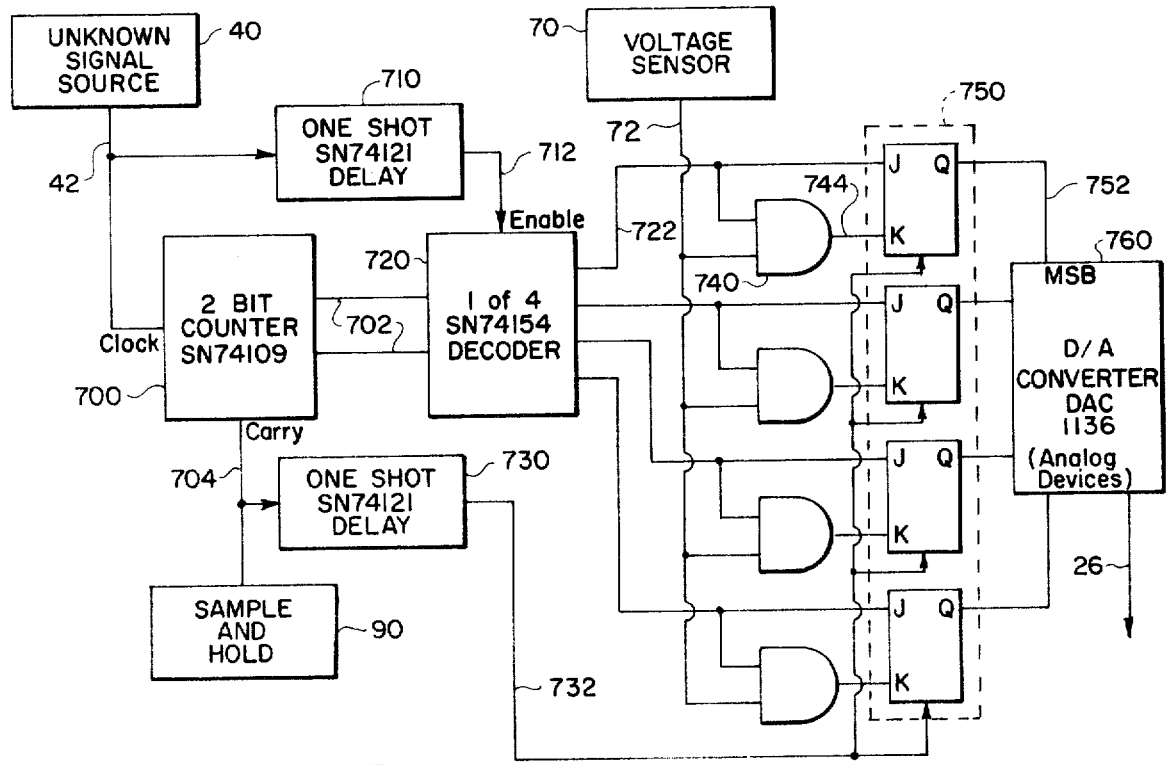
FIG. 7 is an electronic schematic for the second embodiment for the sampling circuit of the present invention.

FIG. 7 shows a second embodiment setting forth the above method of resolution. FIG. 7 shows the modifications necessary to the bias current generator 30 to perform the teachings of the second embodiment. The trigger signals on lead 42 from the unknown signal source 40 increment a two bit counter 700. The first trigger pulse sets the counter to zero. The state of the two bit counter 700 is delivered over leads 702 to a one out of four decoder 720. Hence, initially the most significant bit appearing on lead 722 is set to one and is delivered into a D-type Flip Flop 750. Initially, therefore, the address loaded into the Flip Flop register 750 is 1000. This is decoded over leads 752 by a D-to-A converter 760 into a negative bias level as previously discussed. However, it is to be noted that this negative bias level is a mid-range value between a high value (represented by 1111) and a low value (represented by 0000). This initial bias current $I_b$ from the D-to-A converter 760 is delivered on lead 26 to the summing junction 28. If no voltage pulse is sensed by circuit 70, then the next trigger pulse increments counter 700 causing the value 1100 to be stored in the Flip Flop register. This provides the next higher mid-range value. On the other hand, if a voltage pulse is delivered on lead 72, the most significant bit is reset to zero via gate 740 and the next trigger pulse increments the counter and sets the Flip Flop register to 0100 which is the next lower mid-range value. By continuing in this fashion, the unknown signal value can be quickly resolved. The fifth trigger pulse rolls the two bit counter over to zero and generates a carry signal on lead 704 which activates the sample and hold circuit 90 to hold the value of lead 102 as previously discussed. After a slight delay provided by circuit 730, the Flip Flop register 750 is cleared. The pulse on lead 732 also advances the delay counter 74 for the next determination in the X-Y display. The one-shot 710 strobes the one-of-four decoder in order to load the desired bit values into Flip Flop register 750. Hence, the circuit shown in FIG. 7 rapidly ascertains within four trigger pulses, the value of the unknown signal to an accuracy of four bits. Greater accuracy can be obtained by expanding the counter, one-of-N decoder, and Flip Flop register as required.

Although the present invention has been described with a certain degree of particularity, it is understood that the present disclosure has been made by way of example and that changes in details of structure may be made without departing from the spirit thereof.

I claim:

1. A sampling circuit for determining the value of an analog current signal, said circuit comprising:
    means for generating sampling pulses,
    means for generating steps of increasing bias current, said sampling pulse generating means being capable of generating one sampling pulse at a predetermined time in each of said steps, and
    means receptive of said sampling current pulses, said bias current steps, and of said analog current signal for switching from a first state to a second state to generate an output signal only when the sum of the current from said sample pulse, said analog signal, and from said bias step exceeds a predetermined value, the value of said bias current when said output signal is generated being proportional to said analog current value.

2. A sampling circuit for determining the value of an analog current signal, said circuit comprising:
    means for generating trigger pulses,
    means receptive of each of said trigger pulses for generating a sampling current pulse, said sampling current pulse being much shorter in time duration than said trigger pulse,
    means for generating steps of increasing bias current, said trigger pulse generating means being capable of generating one trigger pulse at a predetermined time in each of said steps, and
    means receptive of said sampling current pulses, said bias current steps, and of said analog current signal for switching from a first state to a second state to generate an output signal only when the sum of the current from said sample pulse, said analog signal, and from said bias step exceeds a predetermined value, the value of said bias current when said output signal is generated being proportional to said analog current value.

3. A sampling circuit for determining the value of an analog current signal, said circuit comprising:
    means for generating trigger pulses,
    means receptive of each of said trigger pulses for generating a sampling voltage pulse, said sampling voltage pulse being much shorter in time duration than said trigger pulse,
    means receiving said sampling voltage pulse for converting said voltage pulse into a sampling current pulse,
    means for generating steps of increasing bias current, said trigger pulse generating means being capable of generating one trigger pulse at a predetermined time in each of said steps, and
    means receptive of said sampling current pulses, said bias current steps, and of said analog current signal for switching from a first state to a second state to generate an output signal only when the sum of the current from said sample pulse, said analog signal, and from said bias step exceeds a predetermined value, the value of said bias current when said output signal is generating being proportional to said analog current value.

4. A sampling circuit for determining the value of an analog current signal, said circuit comprising:
    means for generating trigger pulses,
    a first Josephson junction operative upon receipt of each of said trigger pulses for generating a sampling voltage pulse,
    means receiving said sampling voltage pulse for converting said voltage pulse into a sampling current pulse,
    means for generating steps of increasing bias current, said trigger pulse generating means being capable of generating one trigger pulse at a predetermined time in each of said steps, and
    a second Josephson junction receptive of said sampling current pulses, said bias current steps, and of said analog current signal, for switching from a first state to a second state to generate an output signal only when the sum of the current from said sampling pulse, said analog signal and said bias step exceeds the critical current value of said second junction, the value of said bias current when said output signal is generated being proportional to said analog current value.

5. A sampling circuit for determining when the value of an analog current signal exceeds a predetermined value, said circuit comprising:
    means for generating trigger pulses,
    a first Josephson junction operative upon receipt of each of said trigger pulses for generating a sampling voltage pulse,
    means receiving said sampling voltage pulse for converting said voltage pulse into a sampling current pulse,
    a second Josephson junction receptive of said sampling current pulse and of said analog current signal for switching from a first state to a second state only when the sum of the current from said sampling pulse and from said analog signal exceeds the critical current value of said second junction.

6. A method for determining the value of an analog current signal, said method comprising the steps of:
    (a) generating a trigger pulse,
    (b) generating a pulse of sampling current in response to the occurrence of said trigger pulse,
    (c) producing bias current,
    (d) generating an output signal only when the sum of the current from said bias current, said sampling current, and said analog current exceeds a predetermined value,
    (e) decreasing the bias current in response to the presence of said output signal,
    (f) increasing the bias current in response to the lack of said output signal, and
    (g) repeating steps (a) through (f) a predetermined number of cycles so that a set rate of sampling accuracy is obtained.

7. A method for determining the value of an analog current signal at a point in time, said method comprising the steps of:
    (a) generating a trigger pulse,
    (b) generating a pulse of sampling current in response to the occurrence of said trigger pulse,
    (c) producing this current,
    (d) generating an output signal only when the sum of the current from said bias current, said sampling current, and said analog current exceeds a predetermined value,
    (e) increasing the bias current a predetermined amount in response to the lack of said output signal, and
    (f) repeating steps (a) through (e) until said output signal is generated.

8. A method for determining the value of an instantaneous analog current signal, said method comprising the steps of:
   (a) generating a synchronously occurring trigger pulse,
   (b) generating a sampling current pulse in response to the occurrence of each trigger pulse,
   (c) producing bias current in a series of increasing current steps, and
   (d) generating an output signal representative of said value only when the sum of the current from said sampling current pulse, said bias current step, and said instantaneous analog current signal exceeds a predetermined value.

* * * * *